United States Patent
Fudeta

(10) Patent No.: US 8,154,035 B2
(45) Date of Patent: Apr. 10, 2012

(54) NITRIDE SEMICONDUCTOR LIGHT EMITTING ELEMENT

(75) Inventor: Mayuko Fudeta, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 84 days.

(21) Appl. No.: 12/642,205

(22) Filed: Dec. 18, 2009

(65) Prior Publication Data

US 2010/0163901 A1   Jul. 1, 2010

(30) Foreign Application Priority Data

Dec. 26, 2008   (JP) ................. 2008-332308
Oct. 20, 2009   (JP) ................. 2009-241053

(51) Int. Cl.
   *H01L 29/205*  (2006.01)
   *H01L 21/00*   (2006.01)
(52) U.S. Cl. .......................... 257/91; 438/39
(58) Field of Classification Search .......... 438/22–30, 438/39–43; 257/91, 103; 117/90
See application file for complete search history.

(56) References Cited

U.S. PATENT DOCUMENTS

| 6,620,238 B2 * | 9/2003 | Tsuda et al. ............. 117/90 |
| 7,615,798 B2 * | 11/2009 | Sanga et al. ............. 257/99 |
| 2002/0014681 A1 | 2/2002 | Tsuda et al. |
| 2005/0212002 A1 | 9/2005 | Sanga et al. |
| 2008/0121903 A1 | 5/2008 | Hiramatsu et al. |

FOREIGN PATENT DOCUMENTS

| JP | 2002-208757 | 7/2002 |
| JP | 2005-259970 | 9/2005 |
| JP | 2005-317931 | 11/2005 |
| JP | 4016062 | 9/2007 |
| JP | 2008-153634 | 7/2008 |

* cited by examiner

*Primary Examiner* — Calvin Lee
(74) *Attorney, Agent, or Firm* — Morrison & Foerster LLP

(57) ABSTRACT

In a nitride semiconductor light emitting element, a light transmitting substrate has an upper surface on which a nitride semiconductor layer including at least a light emitting layer is formed. On the upper surface of the light transmitting substrate, recess regions and rise regions are formed. One of each of the recess regions and each of the rise regions is formed by a polygon having at least one apex having an interior angle of 180° or greater when viewed in a planar view. The other of each of the recess regions and each of the rise regions is formed not to be connected to one another in a straight line when viewed in a planar view. A nitride semiconductor light emitting element having such a configuration has excellent light extraction efficiency and can be manufactured at a moderate cost.

16 Claims, 3 Drawing Sheets

NITRIDE SEMICONDUCTOR LIGHT EMITTING ELEMENT

This nonprovisional application is based on Japanese Patent Application No. 2008-332308 filed on Dec. 26, 2008 and No. 2009-241053 filed on Oct. 20, 2009, with the Japan Patent Office, the entire contents of which are hereby incorporated by reference.

BACKGROUND OF THE INVENTION

1. Field of the Invention

The present invention relates to a nitride semiconductor light emitting element, in particular, to a nitride semiconductor light emitting element with a light transmitting substrate having an upper surface provided with recesses and rises.

2. Description of the Background Art

Conventionally, for nitride semiconductor light emitting elements, sapphire ($Al_2O_3$) substrates, SiC substrates, GaN substrates, spinel ($MgAl_2O_4$) substrates, and the like have been used. Such nitride semiconductor light emitting elements are different from other compound semiconductor light emitting elements in that they employ the above-described substrates, which have a light transmitting property for the wavelength of emitted light. Since each of the substrates allows emitted light to transmit therethrough as such, light can be extracted not only from a surface of a semiconductor layer but also from a side surface of the substrate.

In a usual semiconductor light emitting element, a semiconductor layer is formed to have a thickness of several μm or so and a substrate has a thickness of approximately 100 μm. Hence, if light can be effectively extracted from a side surface of the substrate, light extraction efficiency in the semiconductor light emitting element can be improved significantly.

A nitride semiconductor layer has a refractive index of approximately 2.4, whereas, for example, a sapphire substrate has a refractive index of approximately 1.7. Therefore, when an interface between the nitride semiconductor layer and the sapphire substrate is irradiated with light entering at an incident angle greater than a critical angle, the light is totally reflected. The light thus reflected is repeatedly reflected in the nitride semiconductor layer, i.e., results in multiple reflections. During the multiple reflections, the light is absorbed and attenuated in an electrode or active layer formed on a surface of the semiconductor light emitting element. This results in weak intensity of light extracted externally.

A semiconductor light emitting element allowing for improved light extraction efficiency is disclosed in Japanese Patent Laying-Open No. 2005-317931. In the semiconductor light emitting element described in Japanese Patent Laying-Open No. 2005-317931, circular or triangular rises are formed on a surface of a sapphire substrate, and a nitride semiconductor layer is formed thereon. This scatters light having reached an interface between the sapphire substrate and the nitride semiconductor layer, and allows the light to come into the sapphire substrate. As a result, light is extracted at an increased rate from a side surface of the sapphire substrate to improve light extraction efficiency.

Meanwhile, a light emitting diode having very high light emitting efficiency is disclosed in Japanese Patent Laying-Open No. 2008-153634. In the light emitting diode described in Japanese Patent Laying-Open No. 2008-153634, rises each made from a dielectric formed of a material different from that of a substrate are formed on the substrate, and a nitride semiconductor layer is grown thereon. The rises each have a hexagonal shape, and are arranged in the form of a honeycomb structure when viewed in a planar view. The recesses and rises thus formed on the surface of the substrate scatter light to prevent multiple reflections thereof and accordingly improve light extraction efficiency.

Further, a semiconductor light emitting element allowing for improved light extraction efficiency and reduced operation voltage is disclosed in Japanese Patent Laying-Open No. 2005-259970. In the semiconductor light emitting element described in Japanese Patent Laying-Open No. 2005-259970, hexagonal recesses and rises are formed on a surface of a p type contact layer rather than on the substrate side to improve light extraction efficiency.

The conventionally used sapphire substrates, SiC substrates, spinel substrates, and the like are formed of a material different from that of the nitride semiconductor layer. Hence, when a nitride semiconductor layer is grown on each of such substrates, a multiplicity of defects such as threading dislocations occur due to mismatch in lattice constant or a difference in thermal expansion coefficient between the substrate and the nitride semiconductor.

A nitride semiconductor structure allowing for reduced threading dislocations in a nitride semiconductor film is disclosed in Japanese Patent No. 4016062. On the growth face of a substrate in the nitride semiconductor structure described in Japanese Patent No. 4016062, recesses and rises both made of the same material as that of the substrate are formed to facilitate lateral growth for improved crystal quality. The recesses are constituted by line-shaped grooves extending in a plurality of directions and can facilitate the nitride semiconductor film to grow in a direction perpendicular to each of the grooves, thus achieving reduced density of threading dislocations reaching the active layer. In this way, a light emitting diode with high light emitting efficiency can be manufactured.

Furthermore, a nitride semiconductor substrate having good crystallinity resulting from restricting warping of the substrate is disclosed in Japanese Patent Laying-Open No. 2002-208757. The nitride semiconductor substrate described in Japanese Patent Laying-Open No. 2002-208757 has a surface on which polygonal or circular recesses are formed, and a nitride semiconductor film is grown thereon. In this way, threading dislocations are converged in the respective centers of the recesses to reduce warping of the substrate.

SUMMARY OF THE INVENTION

Even though recesses and rises are formed on the substrate or the p type contact layer as in each of the above-described semiconductor light emitting elements of Japanese Patent Laying-Open No. 2005-317931, Japanese Patent Laying-Open No. 2008-153634, Japanese Patent Laying-Open No. 2005-259970, and Japanese Patent No. 4016062, light cannot be effectively scattered depending on the shapes and arrangements of the recesses and rises. Accordingly, emitted light may be reflected repeatedly and attenuated in the semiconductor layer, resulting in poor light extraction efficiency. In addition, in the nitride semiconductor substrate described in Japanese Patent Laying-Open No. 2002-208757, the recesses are formed to reduce warping of the substrate, but the shape of each recess is not particularly specified.

The present invention is made to solve the above-described problem, and its object is to provide a nitride semiconductor light emitting element having a substrate provided with, in a high density, recesses and rises capable of scattering light effectively, and having excellent light extraction efficiency.

In a nitride semiconductor light emitting element according to the present invention, a nitride semiconductor layer including at least a light emitting layer is formed on a light transmitting substrate. The light transmitting substrate has an upper surface on which recess regions and rise regions are formed. One of each of the recess regions and each of the rise regions is formed by a polygon having at least one apex having an interior angle of 180° or greater when viewed in a planar view. The other of each of the recess regions and each of the rise regions is formed not to be connected to one another in a straight line when viewed in a planar view.

According to the present invention, since the recess regions or rise regions each having the shape of a polygon having an interior angle of 180° or greater is formed on the substrate, there are formed spaces at portions opposite to the portions each having the interior angle. In each of the spaces, an adjacent recess region or rise region is disposed. In this way, the recess regions and the rise regions can be formed in close proximity to one another on the substrate in high density.

Light emitted from the light emitting layer is scattered by boundaries between the recess regions and the rise regions thus formed on the upper surface of the substrate, and comes into the substrate. As such, since the boundaries between the recess regions and the rise regions are disposed in high density on the substrate, the light can come into the substrate at a high rate. As a result, an increased amount of light can be extracted from the substrate. In this way, a nitride semiconductor light emitting element having excellent extract efficiency can be manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A nitride semiconductor light emitting element of one embodiment according to the present invention will be described below with reference to figures.

Figure 1:
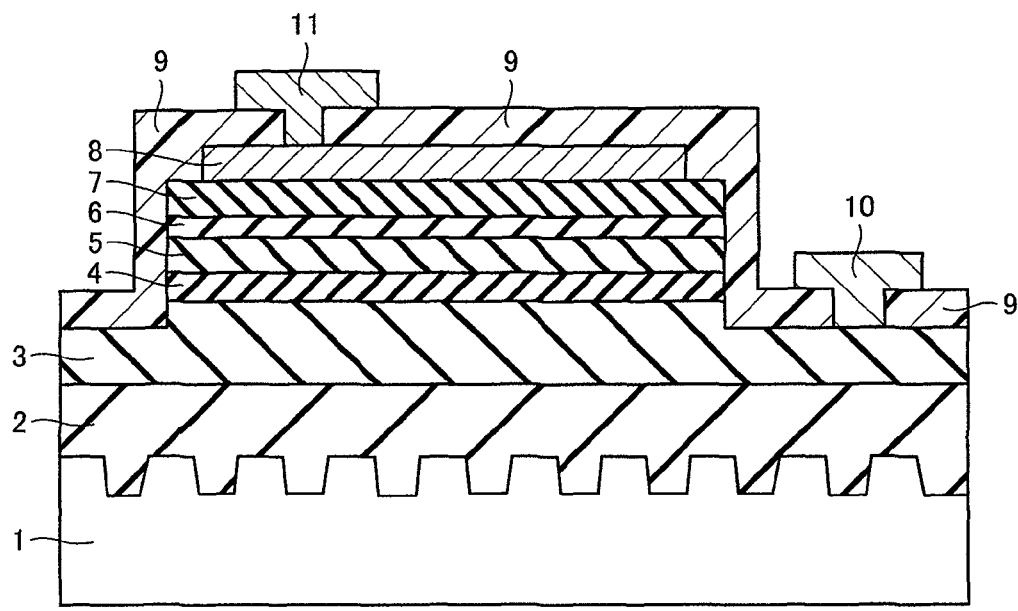
FIG. 1 is a cross sectional view showing a nitride semiconductor light emitting element according to one embodiment of the present invention.

FIG. 1 is a cross sectional view showing a nitride semiconductor light emitting element according to one embodiment of the present invention. As shown in FIG. 1, the nitride semiconductor light emitting element according to one embodiment of the present invention has a light transmitting substrate 1 having an upper surface provided with recess regions and rise regions. As light transmitting substrate 1, a sapphire substrate can be employed, for example.

On the upper surface of light transmitting substrate 1, a buffer layer made of GaN is formed. On the upper surface of light transmitting substrate 1, the buffer layer is formed on at least the upper surface of each of the rise regions and the bottom surface of each of the recess regions. As the buffer layer, a buffer layer made of AlN may be formed. As described below, formation of such an AlN buffer layer achieves improved light output in the nitride semiconductor light emitting element. Formed on the upper surface of the GaN buffer layer is a non-doped GaN layer 2 having recesses and rises corresponding to the rises and recesses of light transmitting substrate 1, and having a thickness of approximately 3 µm.

Formed on the upper surface of non-doped GaN layer 2 is an n type GaN layer 3 having a thickness of approximately 2 µm. On the upper surface of n type GaN layer 3, an SL (Semiconductor superlattice) layer 4 constituted by non-doped GaN and InGaN is formed. On the upper surface of SL layer 4, a light emitting layer 5 is formed.

Light emitting layer 5 is constituted by an MQW (Multiple-Quantum Well) in which six barrier layers each made of GaN and six well layers each made of InGaN are provided on top of each other alternately. On the upper surface of light emitting layer 5, a p type AlGaN layer 6 having a thickness of approximately 20 nm is formed. On the upper surface of p type AlGaN layer 6, a p type GaN layer 7 having a thickness of approximately 80 nm is formed.

On the upper surface of p type GaN layer 7, a current diffusing layer 8 having a thickness of approximately 200 nm is formed. Current diffusing layer 8 is formed of ITO (Indium Tin Oxide). An insulative protecting film 9 is formed to cover current diffusing layer 8 and the upper surface of n type GaN layer 3, with portions thereof left uncovered. Insulative protecting film 9 has a thickness of approximately 200 nm and is made of $SiO_2$.

On the upper surface of current diffusing layer 8 at the portion not covered with insulative protecting film 9, a p type pad electrode 11 is formed. On the upper surface of n type GaN layer 3 at the portion not covered with insulative protecting film 9, an n type pad electrode 10 is formed. Each of n type pad electrode 10 and p type pad electrode 11 is formed by layering Ti with a thickness of approximately 20 nm, Mo with a thickness of approximately 30 nm, and Au with a thickness of approximately 500 nm.

The following describes a method for forming the nitride semiconductor light emitting element according to the present embodiment. First, for example, a c-plane sapphire substrate is employed as light transmitting substrate 1. To form the recess and rise regions thereon, a resist is patterned on the upper surface of the sapphire substrate. With the resist used as a mask, the sapphire substrate is dry-etched to have a depth of approximately 1 µm.

Then, the resist is removed from the sapphire substrate. The sapphire substrate having the recess and rise regions formed on its upper surface is introduced into an MOCVD (Metal Organic Chemical Vapor Deposition) device. In the device, the sapphire substrate is cleaned for five minutes while being subjected to a flow of hydrogen of 1100° C.

Thereafter, on the sapphire substrate, the buffer layer made of GaN is grown.

On the buffer layer, non-doped GaN layer 2 is grown to have a thickness of approximately 3 μm. On non-doped GaN layer 2, n type GaN layer 3 is grown to have a thickness of approximately 2 μm. On n type GaN layer 3, SL layer 4 constituted by non-doped GaN and InGaN is grown. Grown on SL layer 4 is light emitting layer 5 constituted by the MQW in which the barrier layers made of GaN and the well layers made of InGaN are grown for six cycles. On light emitting layer 5, p type AlGaN layer 6 is grown to have a thickness of approximately 20 nm. On p type AlGaN layer 6, p type GaN layer 7 is grown to have a thickness of approximately 80 nm.

The above-described buffer layer made of GaN is formed on at least the upper surfaces of the rise regions and the bottom surfaces of the recess regions provided on the upper surface of the sapphire substrate. When growing non-doped GaN layer 2 on the upper surface of the sapphire substrate, GaN on the upper surfaces of the rise regions provided with the buffer layer and GaN on the bottom surfaces of the recess regions provided therewith grow to meet and be connected to each other.

On the surface of p type GaN layer 7, for current diffusing layer 8 and a contact electrode, ITO is sputtered up to a thickness of approximately 200 nm. A resist is formed thereon for patterning of the contact electrode. With the resist employed as a mask, the ITO is etched using an etching solution containing hydrochloric acid or oxalic acid.

Thereafter, the resist is removed, and the layered structure obtained through the above process is alloyed under an atmosphere containing oxygen. This simultaneously provides activation of p type AlGaN layer 6 and p type GaN layer 7, reduced resistance in an ohmic contact between current diffusing layer 8 and p type GaN layer 7, and transparency in the ITO.

Next, a resist for mesa etching is formed on the upper surface of the above-described layered structure. With the resist employed as a mask, mesa etching is performed using ICP (Inductively coupled plasma) to expose n type GaN layer 3 at the surface of the layered structure. Thereafter, as insulative protecting film 9, $SiO_2$ is formed to have a thickness of approximately 200 nm.

In insulative protecting film 9, openings are formed at locations at which n type pad electrode 10 and p type pad electrode 11 are to be formed. In order to form the openings, a resist is patterned on the upper surface of insulative protecting film 9 to correspond to the openings. With the resist employed as a mask, dry etching is performed using $CHF_3$ gas. The location where p type pad electrode 11 is to be formed is etched until the ITO is exposed, whereas the location where n type pad electrode 10 is to be formed is etched until n type GaN layer 3 is exposed.

An etching selectivity of the etching gas, $CHF_3$, to $SiO_2$ constituting insulative protecting film 9 and ITO constituting current diffusing layer 8 is 5 or greater. Hence, in the etching using $CHF_3$, the ITO serves as an etching stop layer. Likewise, an etching selectivity of the etching gas, $CHF_3$, to $SiO_2$ constituting insulative protecting film 9 and n type GaN layer 3 is 5 or greater. Hence, in the etching using $CHF_3$, n type GaN layer 3 serves as an etching stop layer.

Thereafter, the resist is removed and another resist is formed for formation of the pad electrodes. With the resist employed as a mask, Ti is deposited to have a thickness of approximately 20 nm, Mo is deposited to have a thickness of approximately 30 nm, and Au is deposited to have a thickness of approximately 500 nm. Through a so-called lift-off method, by which the metals deposited on the resist are removed together with the resist, n type pad electrode 10 and p type pad electrode 11 are simultaneously formed. In this way, the nitride semiconductor light emitting element according to the present embodiment is formed.

In the nitride semiconductor light emitting element according to the present embodiment, current diffusing layer 8 and the contact electrode allow current to flow in the entire surface of the light emitting element efficiently, and the entire surface of light emitting layer 5 therefore emits light uniformly. The emitted light is propagated from light emitting layer 5 to the interface between the sapphire substrate and the non-doped GaN layer 2, via the nitride semiconductor layer. Since the upper surface of the sapphire substrate is provided with the recess and rise regions, the light is prevented from being reflected at the interface, whereby the light comes into the sapphire substrate efficiently.

The sapphire substrate has a refractive index of approximately 1.7, which is relatively close to that of a generally used molding resin, i.e., a refractive index of approximately 1.5. Hence, the light having entered the sapphire substrate is effectively extracted to outside from the rear surface or side surface of the sapphire substrate. Further, the recess and rise regions formed on the upper surface of the sapphire substrate are provided to have a predetermined shape and are positioned in a predetermined arrangement to achieve improved light extraction efficiency.

Figure 2A:
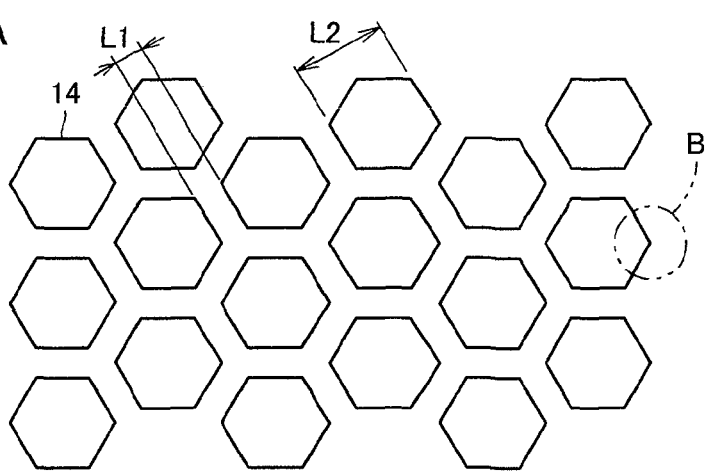
FIG. 2A is a plan view showing recess regions and rise regions of the upper surface of a light transmitting substrate of a nitride semiconductor light emitting element of a comparative example.
Figure 2B:
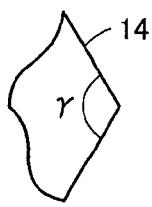
FIG. 2B is an enlarged plan view of a portion of the recess and rise regions.
Figure 2C:
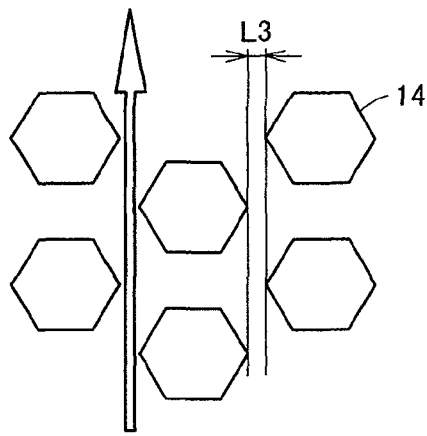
FIG. 2C is a plan view showing a state in which light is not scattered by the recess and rise regions and passes therethrough.

The following describes the recess and rise regions formed on the upper surface of light transmitting substrate 1. First, comparative examples to the nitride semiconductor light emitting element according to the present embodiment will be described. FIG. 2A is a plan view showing recess regions and rise regions on the upper surface of a light transmitting substrate of a nitride semiconductor light emitting element of a comparative example. FIG. 2B is an enlarged plan view showing a portion of the recess and rise regions. FIG. 2C is a plan view showing a state in which light is not scattered by the recess and rise regions and passes therethrough.

Light generated in light emitting layer 5 of the nitride semiconductor light emitting element is propagated in the semiconductor layer and reaches the upper surface of light transmitting substrate 1, but the direction in which the light travels may be parallel to the upper surface of light transmitting substrate 1 on this occasion. In this case, the light never enters light transmitting substrate 1 unless the direction in which the light travels is changed by reflection or scattering.

When hexagons 14 serving as the rise regions are formed on the upper surface of light transmitting substrate 1 as shown in FIG. 2C, light may travel straight in the recess regions as indicated by an arrow therein. Such light will be repeatedly reflected within the element, be attenuated, and cannot be extracted from the substrate to outside. Accordingly, the formed recess and rise regions may not be able to contribute to improvement of light extraction efficiency. It should be noted that the recess regions and rise regions may be interchanged, i.e., each of the recess regions may be formed to have the shape of a hexagon 14.

Figure 3:
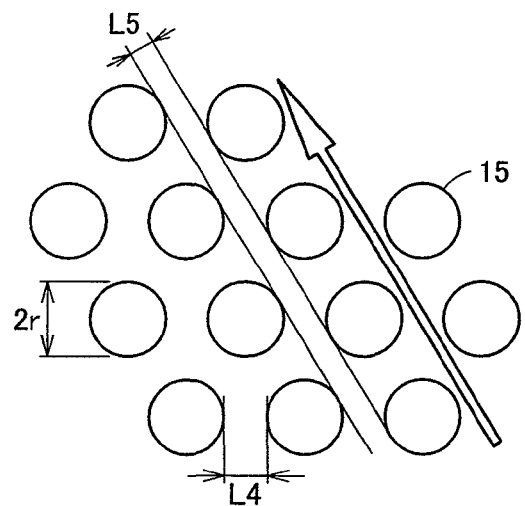
FIG. 3 is a plan view showing recess regions and rise regions of the upper surface of a light transmitting substrate of a nitride semiconductor light emitting element of a comparative example.

FIG. 3 is a plan view of recess regions and rise regions on the upper surface of a light transmitting substrate of a nitride semiconductor light emitting element of a comparative example. When circles 15 serving as the rise regions are formed on the upper surface of the light transmitting substrate as shown in FIG. 3, light may travel straight in the recess regions as indicated by an arrow therein. Such light will be repeatedly reflected within the element, be attenuated, and cannot be extracted from the substrate to outside. Accordingly, the formed recess and rise regions may not be able to contribute to improvement of light extraction efficiency. It should be noted that the recess and rise regions may be interchanged, i.e., each of the recess regions may be formed to have the shape of a circle.

Even when the rise regions and recess regions are formed to have the shapes of hexagons 14 and circles 15, there are some arrangements that can prevent light from traveling straight in the element and resulting in multiple reflection. As shown in FIG. 2A, let an interval between adjacent hexagons be L1 and let an interval between opposing sides of a hexagonal be L2. In this case, as shown in FIG. 2C, a width L3 allowing light to travel straight is expressed by $L3=\sqrt{3}/2 \times L1 - \sqrt{3}/6 \times L2$. When $L3 \leq 0$, light will hit boundaries between the recess regions and the rise regions and will be scattered accordingly.

To form on the upper surface of light transmitting substrate 1 the rise regions and recess regions each having a fine shape, a stepper for patterning a resist is employed. A stepper capable of forming a finer shape is more expensive. Hence, to reduce L1, L2 in hexagons 14 shown in FIG. 2A, an expensive stepper needs to be used, resulting in increased manufacturing cost of the light emitting diode. Generally, to manufacture a light emitting diode, a stepper capable of forming a shape with a size of approximately 1 μm is used.

Thus, with L1=1 μm, which can be formed by such a general stepper, $L3 \leq 0$ when $L2 \geq 3$ μm. In other words, the interval between opposing sides of each hexagon 14 needs to be 3 μm or greater to prevent light from traveling in parallel with the upper surface of light transmitting substrate 1 within the semiconductor layer in the vicinity of the interface with light transmitting substrate 1.

As shown in FIG. 2B, each hexagon 14 has an interior angle γ of 180° or smaller. Hence, if the plurality of hexagons 14 are provided so that adjacent hexagons 14 are arranged not in contact with each other but are arranged in close proximity to each other at a side opposite to a region sandwiched between one side and its adjacent side of an apex having interior angle γ (360°−γ) in order to prevent light from traveling straight within the element, the sizes of the rise regions and recess regions will be large.

Meanwhile, as a method that costs less than the method employing the above-described stepper, a contact type exposure device is employed to form the rise and recess regions on the upper surface of the light transmitting substrate. In this case, the size of a formable shape is about 2 μm in general. With L1=2 μm, $L3 \leq 0$ when $L2 \geq 6$ μm. As such, in the case where such a contact type exposure device is employed, the interval of opposing sides of a hexagon 14 needs to be 6 μm or greater to prevent light from traveling straight in parallel with the upper surface of light transmitting substrate 1 within the semiconductor layer in the vicinity of the interface with light transmitting substrate 1.

Similarly, in the case where circles 15 shown in FIG. 3 are formed to serve as the rise regions, let the radius of each circle be r and let an interval between adjacent circles be L4. In this case, a width L5 allowing light to travel straight is expressed by $L5=\sqrt{3}/2 \times L4 + (\sqrt{3}-2) \times r$. If a general stepper is employed to pattern a resist for formation of circles 15 serving as the rise regions on the upper surface of light transmitting substrate 1, circles 15 each having a shape with a size of approximately 1 μm can be formed.

Thus, with L4=1 μm, which can be formed by such a general stepper, $L5 \leq 0$ when $r \geq 4.8$ μm. In other words, circles 15 to be formed needs to have a diameter of 9.6 μm or greater to prevent light from traveling straight in parallel with the upper surface of light transmitting substrate 1 on the upper surface of light transmitting substrate 1.

As such, if the rise regions are formed in the form of hexagons 14 or circles 15, each of the rise regions needs to have a size of 3 μm or greater to prevent multiple reflections of light. However, to achieve improved light scattering probability for better efficiency of extracting light from light transmitting substrate 1, the sizes of the rise regions and recess regions should be small and boundaries between the rise regions and the recess regions should be provided in high density on light transmitting substrate 1. Required are rise regions and recess regions, which are not large in size and are shaped to be provided in high density on the upper surface of light transmitting substrate 1.

Figure 4A:
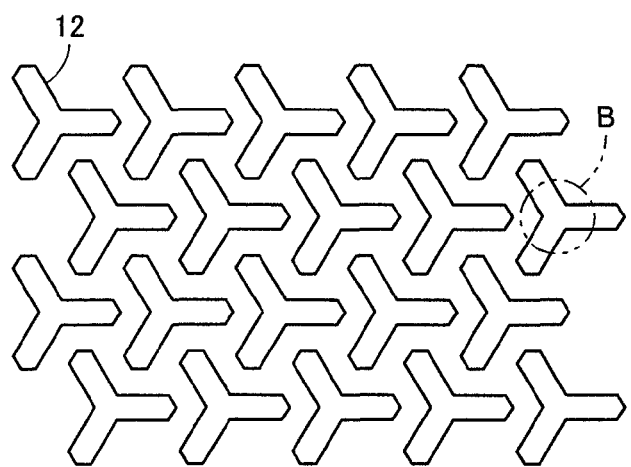
FIG. 4A is a plan view showing rise regions and recess regions formed on the upper surface of a light transmitting substrate of the nitride semiconductor light emitting element according to the embodiment.
Figure 4B:
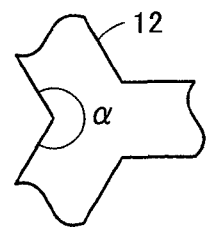
FIG. 4B is an enlarged plan view showing a portion of the rise and recess regions.

The following describes the rise and recess regions formed on the upper surface of light transmitting substrate 1 of the nitride semiconductor light emitting element according to the present embodiment. FIG. 4A is a plan view showing the rise and recess regions formed on the upper surface of the light transmitting substrate of the nitride semiconductor light emitting element according to the present embodiment. FIG. 4B is an enlarged plan view of a portion of the rise and recess regions.

As shown in FIG. 4A, on the upper surface of light transmitting substrate 1 of the nitride semiconductor light emitting element according to the present embodiment, the plurality of rise regions and recess regions are formed. In FIG. 4A, the rise regions may be formed in the form of polygons 12 and the recess regions may have shapes obtained by removing polygons 12. Alternatively, the recess regions are formed in the form of polygons 12 and the rise regions may have shapes obtained by removing polygons 12.

As shown in FIG. 4B, one of each rise region and each recess region is constituted by a polygon 12 with at least one apex having an interior angle α of 180° or greater when viewed in a planar view. As shown in FIG. 4A, polygon 12 has three apexes each having interior angle α of 180° or greater. A plurality of such polygons 12 are arranged on the upper surface of light transmitting substrate 1.

The other of each rise region and each recess region is formed not to be connected to one another in a straight line when viewed in a planar view. Thus, the plurality of rise regions and recess regions are formed entirely on the upper surface of light transmitting substrate 1. Light traveling in parallel with the upper surface of light transmitting substrate 1 within the semiconductor layer in the vicinity of the interface with light transmitting substrate 1 therefore surely hit side surfaces existing in the boundaries between the rise regions and the recess regions in all the directions. Light having hit a side surface is scattered and comes into light transmitting substrate 1.

With the rise and recess regions thus formed, light traveling in parallel with the upper surface of light transmitting substrate 1 within the semiconductor layer in the vicinity of the interface with light transmitting substrate 1 can be scattered and come into light transmitting substrate 1. As a result, an increased amount of light can be extracted from the side surfaces or lower surface of light transmitting substrate 1, thus achieving improved light extraction efficiency of the light emitting element.

Further, each polygon 12 includes three apexes each having interior angle α of 180° or greater. Hence, when arranging the plurality of polygons 12, adjacent polygons 12 can be positioned not in contact with but in close proximity to one another in spaces formed in regions each external to each polygon 12 and each interposed between two adjacent sides constituting an apex having interior angle α. In the embodiment shown in FIG. 4A, each polygon 12 has three radially projecting portions with spaces between adjacent projecting portions thereof. In each space at the polygon, a projecting portion of an adjacent polygon is disposed.

By arranging polygons 12 in this way, boundaries between the recess regions and the rise regions can be formed in high density on the upper surface of light transmitting substrate 1 without making the size of each polygon 12 larger. Accordingly, light traveling straight within the semiconductor layer in the vicinity of the interface with light transmitting substrate 1 can be scattered and come into light transmitting substrate 1 at a high rate. In addition, these rise and recess regions can be formed using a general stepper, so the nitride semiconductor light emitting element according to the present embodiment can be manufactured at a moderate cost.

Figure 5A:
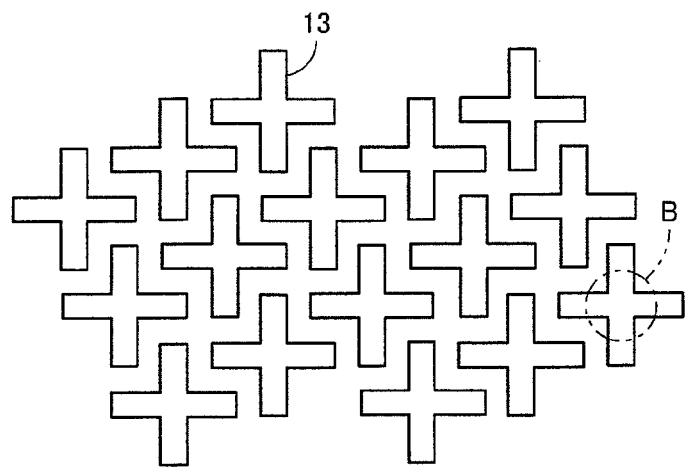
FIG. 5A is a plan view showing rise regions and recess regions formed on the upper surface of the light transmitting substrate of the nitride semiconductor light emitting element according to the embodiment.
Figure 5B:
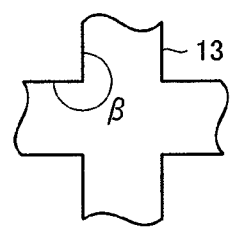
FIG. 5B is an enlarged plan view showing a portion of the rise and recess regions.

FIG. 5A is a plan view showing rise and recess regions formed on the upper surface of the light transmitting substrate of the nitride semiconductor light emitting element according to the present embodiment. FIG. 5B is an enlarged plan view showing a portion of the rise and recess regions.

As shown in FIG. 5A, on the upper surface of light transmitting substrate 1 of the nitride semiconductor light emitting element according to the present embodiment, the rise and recess regions are formed. In FIG. 5A, the rise regions may be formed in the form of polygons 13, and the recess regions may have shapes obtained by removing polygons 13, whereas the recess regions may be formed in the form of polygons 13, and the rise regions may have shapes obtained by removing polygons 13.

As shown in FIG. 5B, one of each rise region and each recess region is constituted by a polygon 13 with four apexes each having an interior angle β of 180° or greater when viewed in a planar view. As shown in FIG. 5A, a plurality of such polygons 13, each of which has four apexes each having interior angle β of 180° or greater, are provided on the upper surface of light transmitting substrate 1.

The other of each rise region and each recess region is formed not to be connected to one another in a straight line when viewed in a planar view. Thus, the plurality of rise regions and recess regions are formed entirely on the upper surface of light transmitting substrate 1. Light traveling in parallel with the upper surface of light transmitting substrate 1 within the semiconductor layer in the vicinity of the interface with light transmitting substrate 1 therefore surely hit side surfaces existing in the boundaries between the rise regions and the recess regions in all the directions. Light having hit a side surface is scattered and comes into light transmitting substrate 1.

With the rise and recess regions thus formed, light traveling in parallel with the upper surface of light transmitting substrate 1 within the semiconductor layer in the vicinity of the interface with light transmitting substrate 1 can be scattered and come into light transmitting substrate 1. As a result, an increased amount of light can be extracted from the side surfaces or lower surface of light transmitting substrate 1, thus achieving improved light extraction efficiency of the light emitting element.

Further, each polygon 13 has four apexes each having interior angle β of 180° or greater. Hence, when arranging the plurality of polygons 13, adjacent polygons 13 can be positioned not in contact with but in close proximity to one another in spaces formed in regions each external to each polygon 13 and each interposed between two adjacent sides constituting an apex having interior angle β. In the embodiment shown in FIG. 5A, each polygon 13 has four radially projecting portions with spaces between adjacent projecting portions thereof. In each space at the polygon, a projecting portion of an adjacent, polygon is disposed.

By arranging polygons 13 in this way, boundaries between the recess regions and the rise regions can be formed in high density on the upper surface of light transmitting substrate 1 without making the size of each polygon 13 larger. Accordingly, light traveling straight in parallel with the upper surface of light transmitting substrate 1 within the semiconductor layer in the vicinity of the interface with light transmitting substrate 1 can be scattered and come into light transmitting substrate 1 at a high rate. In addition, these rise regions and recess regions can be formed using a general stepper, so the nitride semiconductor light emitting element according to the present embodiment can be manufactured at a moderate cost.

Since the nitride semiconductor light emitting element according to the present embodiment has the above-described configuration, light emitted in any angle can be prevented from being totally reflected and can be scattered at the interface between light transmitting substrate 1 and non-doped GaN layer 2. Accordingly, the light can be prevented from being absorbed and attenuated in the electrode layer and the active layer due to multiple reflections within the element, thus achieving improved light extraction efficiency. It should be noted that, in the nitride semiconductor light emitting element according to the present embodiment, the shape of each polygon of the recess or rise regions formed on the upper surface of the light transmitting substrate is not limited to the shapes of the polygons shown in FIG. 4A and FIG. 5A.

In the nitride semiconductor light emitting element according to the present embodiment, the sides constituting a polygon of each recess or rise region may include a side parallel to a crystal plane in the nitride semiconductor layer. In this way, when the nitride semiconductor layer is grown on the upper surface of light transmitting substrate 1, the crystal plane of the nitride semiconductor layer is parallel to the upper surfaces of the rise regions and the bottom surfaces of the recess regions of light transmitting substrate 1 and they are therefore in intimate contact with each other.

In this state, the nitride semiconductor layer is grown to bury the rise and recess regions, whereby occurrence of voids can be prevented. A void is an isolated region having a refractive index close to 1, and is therefore likely to reflect reached light. With occurrence of such voids, light is less likely to come into light transmitting substrate 1 and is therefore highly likely to go back to the inside of the nitride semiconductor layer. Thus, prevention of occurrence of voids allows for improved light extraction efficiency of the nitride semiconductor light emitting element.

In the nitride semiconductor light emitting element according to the present embodiment, each polygon of the recess or rise regions may be constituted by sides in the <11-20> directions of the crystal axes of the nitride semiconductor layer. In the nitride semiconductor layer, closely arranged hexagonal crystals grow. Hence, if the sides constituting each polygon of the recess or rise regions are not parallel to the sides of the hexagonal crystals, grown crystals will have voids.

By constructing the polygons of the recess or rise regions as described above, occurrence of voids can be further reduced, thus achieving improved light extraction efficiency of the nitride semiconductor light emitting element. Further, at the beginning of the growth of the nitride semiconductor layer, dislocations occur in crystals or interfaces among crystals. However, as lateral growth develops, the dislocations are bent to achieve reduced threading dislocations. As a result, internal quantum efficiency can be improved.

In the nitride semiconductor light emitting element according to the present embodiment, each of the recess and rise regions may have a width of 20 μm or smaller. Normally, in one chip of a light emitting diode, a light emitting region has a width of approximately 20 μm at its narrow portion. Within such a width, at least one boundary between the recess and rise regions is preferably included.

When each of the recess and rise regions has a width of greater than 20 μm, multiple reflections repeatedly occur in the regions. As each of the recess and rise regions has a wider width, more multiple reflections occur. Accordingly, light is absorbed more in the electrode layer and the active layer, resulting in decreased light extraction efficiency. When each of the recess and rise regions has a width of 20 μm or smaller, light is reflected a few times in the regions. Thus, influence of the reflections is small, so high light extraction efficiency can be maintained.

In the nitride semiconductor light emitting element according to the present embodiment, the depth or height of the recess regions or the rise regions may be 40 nm or greater. Required to obtain a sufficient effect of scattering light by the recess and rise regions is a height equal to or higher than ¼ of the wavelength of light. The wavelength needs to be considered for an optical path that takes into account the refractive index thereof.

The refractive index of the nitride semiconductor layer varies depending on the wavelength of light and the composition of the nitride semiconductor layer, but is substantially 2.5. A nitride semiconductor light emitting element usually has an emission wavelength of 400 nm or greater. Thus, a required height of the recess and rise regions is: 400 nm×¼×½.5=40 nm or greater. By setting the depth of the recess regions or the height of the rise regions at 40 nm or greater, light can be effectively scattered on the upper surface of light transmitting substrate 1, thus achieving improved light extraction efficiency.

In the nitride semiconductor light emitting element according to the present embodiment, each of the side surfaces of the recess and rise regions may be tapered. To provide tapered side surfaces of the recess and rise regions, a resist with tapered side surfaces is employed as a mask used in etching the light transmitting substrate. In other words, the resist has a cross section of a substantially trapezoidal shape. Through etching using the resist having such a shape as a mask, the recess and rise regions of light transmitting substrate 1 can be provided with tapered side surfaces.

The tapered side surfaces of the recess and rise regions have increased areas, and light is therefore more likely to hit such side surfaces, be excellently scattered by the inclinations thereof, and come into light transmitting substrate 1. Thus, light can be extracted effectively from the side surfaces of light transmitting substrate 1.

When the recess and rise regions do not have tapered side surfaces, the side surfaces of the rise regions are vertical and crystals therefore grow up straight from the bottom surfaces of the recess regions. Accordingly, they are not matched and aligned well with crystals having grown on the upper surfaces of the rise regions, whereby voids are likely to occur.

In contrast, when the recess and rise regions have tapered side surfaces, crystals grow also in the lateral direction along these tapers and are matched and aligned well with the crystals having grown on the upper surfaces of the rise regions. Further, with the tapered side surfaces of the recess and rise regions, the area of the upper surfaces of the rise regions is small and crystals accordingly grow slowly on the upper surfaces of the rise regions. As a result, a difference is small between the height of each crystal having grown up from the bottom surfaces of the recess regions and the height of each crystal having grown on the upper surfaces of the rise regions.

Therefore, the crystals are likely to be aligned with each other, thereby reducing voids. The reduction of voids allows for improved light extraction efficiency of the light emitting element.

Where the recess regions are formed not to be connected to one another in a straight line when viewed in a planar view in the nitride semiconductor light emitting element according to the present embodiment, the recess regions may be formed to be connected to one another in a continuous manner when viewed in a planar view. In this way, the recess regions are not connected to one another in a straight line but are connected to one another in a bent manner. If the recess regions are not connected to one another and are isolated, raw material gas for crystal growth is less likely to reach every corner of the recess regions. Accordingly, voids are likely to occur in the corners of the recess regions.

Since the recess regions are formed to be connected to one another in a continuous manner, the raw material gas for crystal growth reaches every corner of the recess regions. Accordingly, voids are less likely to occur in the recess regions. With such reduction of occurrence of voids, light can be efficiently scattered at the interface between light transmitting substrate 1 and non-doped GaN layer 2, and an increased amount of light can therefore come into light transmitting substrate 1, thereby improving light extraction efficiency of the light emitting element.

Further, since the raw material gas reaches the inside of the recess regions without interruption, crystals stably grow in the recess and rise regions, and then crystals in the recess regions and crystals in the rise regions meet. This causes bending of dislocations having occurred in or between the crystals, to reduce threading dislocations reaching the surface of the light transmitting substrate. Thus, internal quantum efficiency can be improved.

Where the rise regions are formed in the nitride semiconductor light emitting element according to the present embodiment by providing a plurality of polygons each having at least one apex having an interior angle of 180° or greater when viewed in a planar view, the rise regions may be formed discontinuously when viewed in a planar view. Since the rise regions provided by the plurality of polygons are provided discontinuously, adjacent rise regions are positioned close to one another with an interval therebetween. Accordingly, the recess regions are not connected to one another in a straight line. In this way, light can be prevented from traveling straight at the upper surface of the light transmitting substrate, and can be scattered to come into the light transmitting substrate. As a result, an increased amount of light can be extracted from the side surfaces or lower surface of the light transmitting substrate, thus achieving improved light extraction efficiency of the light emitting element.

Further, since the rise regions are formed to be discontinuous to one another, more boundaries between the rise regions and the recess regions can be provided. Accordingly, crystals having grown in the rise regions and the recess regions meet each other to bend dislocations having grown in the crystals and crystal interfaces. This further reduces threading dislocations to achieve improved internal quantum efficiency.

In the nitride semiconductor light emitting element according to the present embodiment, light transmitting substrate 1 may have a refractive index smaller than that of the nitride semiconductor layer. At the interface between light transmitting substrate 1 and the nitride semiconductor layer, light is efficiently scattered, and a larger amount of light accordingly comes into light transmitting substrate 1. Normally, light transmitting substrate 1 is externally covered with a resin, air, or the like.

Since such a resin, air, or the like has a small refractive index, it is preferable that light transmitting substrate 1 also have a small refractive index in order to efficiently extract light to outside from the side surfaces of light transmitting substrate 1. Particularly, in order to extract light from light transmitting substrate 1 more efficiently than from the nitride semiconductor layer, it is preferable that light transmitting substrate 1 have a refractive index smaller than that of the nitride semiconductor layer. More preferably, light transmitting substrate 1 has a refractive index of 2 or less.

In the nitride semiconductor light emitting element according to the present embodiment, light transmitting substrate 1 has a higher transmittance for emitted light than that of the nitride semiconductor layer. If light transmitting substrate 1 has a low transmittance, light is absorbed within light transmitting substrate 1 even though the light has been effectively scattered at the interface between light transmitting substrate 1 and non-doped GaN layer 2 and a large amount of light has come into light transmitting substrate 1. This results in decreased light extraction efficiency.

Hence, to efficiently extract light from the side surfaces of light transmitting substrate 1, the substrate preferably has a high transmittance and more preferably has a transmittance of 90% or greater for visible light. Because the nitride semiconductor layer has a transmittance of approximately 90% for the wavelength of the visible light region, light transmitting substrate 1 preferably has a transmittance of 90% or greater, which is higher than those of the nitride semiconductor crystals.

As described above, in the nitride semiconductor light emitting element according to the present embodiment, the nitride semiconductor layer may include the n type nitride semiconductor layer, light emitting layer 5, and the p type nitride semiconductor layer. In this way, excellent light emitting layer 5 can be formed, thus achieving improved light emitting efficiency of the light emitting element.

As described above, in the nitride semiconductor light emitting element according to the present embodiment, current diffusing layer 8 may be formed on the surface of the p type nitride semiconductor layer. With current diffusing layer 8 thus formed on the surface of the p type nitride semiconductor layer, the entire surface of the nitride semiconductor light emitting element emits light, and uniformly hit the rise and recess regions formed in light transmitting substrate 1. The light is scattered, comes into light transmitting substrate 1, and then is efficiently extracted to the outside from the side surfaces of light transmitting substrate 1, thus achieving improved light extraction efficiency of the light emitting element.

In the nitride semiconductor light emitting element according to the present embodiment, current diffusing layer 8 may include a transparent conductive film. As described above, by using, for example, ITO for current diffusing layer 8, electric current can flow therein while allowing visible light to pass therethrough. This reduces absorption of light in the element.

In the nitride semiconductor light emitting element according to the present embodiment, on a surface of the p type nitride semiconductor layer or current diffusing layer 8, a reflecting layer may be formed to reflect emitted light. In this way, among beams of light emitted from light emitting layer 5, beams of light emitted opposite to the light transmitting substrate 1 side are reflected by the reflecting layer toward light transmitting substrate 1, are scattered by the rise and recess regions in the interface between light transmitting substrate 1 and the nitride semiconductor layer, and come into light transmitting substrate 1. The beams of light are efficiently extracted from the side surfaces of light transmitting substrate 1, the rear surface of light transmitting substrate 1, or the like.

Such a structure is particularly preferable for flip chip mounting. The reflecting layer may be formed directly on the surface of the p type nitride semiconductor layer while using, for example, Ag, a Ag alloy, or the like for a contact electrode. Alternatively, a reflecting layer of Ag, a Ag alloy, or the like may be formed on a surface of current diffusing layer 8 constituted by the transparent conductive film or the n type nitride semiconductor layer. Alternatively, instead of insulative protecting film 9, a reflecting layer constituted by a dielectric multilayer film may be formed.

The numerical values described in the present embodiment are only for illustrative purposes, and the present invention is not limited to these. Further, in the present embodiment, a c-plane sapphire substrate is used for light transmitting substrate 1 but a substrate with other plane direction may be used therefor. Further, ITO is used for current diffusing layer 8, but other transparent conductive films may be used such as IZO, IGO, and ICO. An n type GaN layer may be used for current diffusing layer 8.

When an n type GaN layer is used for current diffusing layer 8, crystals thereof can be grown in an MOCVD device continuously after growth of the p type GaN layer. In this case, the pad electrodes serve as contact electrodes, so no contact electrode needs to be formed in the entire surface of current diffusing layer 8.

The nitride semiconductor light emitting element according to the present embodiment may be mounted on a base such as a frame with the light transmitting substrate 1 side meeting the base, and light may be extracted from the side surfaces of light transmitting substrate 1. Alternatively, as with the flip chip mounting, it may be mounted thereon with the pad electrode side meeting the base, using a bump or the like, and light may be extracted from the rear surface and side surfaces of light transmitting substrate 1.

If the nitride semiconductor light emitting element according to the present embodiment is mounted through the flip chip technology, a reflecting layer made of Ag or a Ag alloy and also serving as a contact electrode may be formed on a surface of the p type GaN layer. Further, on the upper surface of current diffusing layer 8, a reflecting layer made of Ag or a Ag alloy may be formed. Further, insulative protecting film 9 may be constituted by a dielectric multilayer film formed of $SiO_2$ and may be adapted to also serve as a reflecting layer.

EXPERIMENTAL EXAMPLE 1

The following describes results of measuring outputs of light emitting elements having the five patterns of rise regions or recess regions formed on the upper surface of light transmitting substrate 1, i.e., the rise regions or recess regions of FIGS. 2A, 2C, 3, 4A, and 5A. As to the shapes shown in FIGS. 4A, 5A, when the narrowest portion of each of the rise regions had a width of 1.5 μm and the narrowest portion of each of the recess regions had a width of 1.5 μm, the outputs of the corresponding light emitting elements were 30 mW at a voltage of 3.1 V.

As to the shape shown in FIG. 2A, with L1=1 μm and L2=3.5 μm, the output of the light emitting element was 29 mW at a voltage of 3.1 V. As to the shape shown in FIG. 3, with L4=1 μm and r=5 μm, the output of the light emitting element was 27 mW at a voltage of 3.1V. As to the shape shown in FIG. 2C, the output of the light emitting element was approximately 20-25 mW at a voltage of 3.1V.

As such, it can be recognized that the light emitting element with the rise or recess regions each having the shape shown in FIG. 3 had improved light emitting efficiency as compared with the light emitting element with the rise or recess regions each having the shape shown in FIG. 2C, but was inferior in light emitting efficiency to those of the light emitting elements with the rise or recess regions having the shapes shown in FIGS. 4A, 5A.

A conceivable reason for such inferior light emitting efficiency lies in that, in the light emitting element having the rise or recess regions each having the shape shown in FIG. 3, the area of flat portions in the rise and recess regions are large and multiple reflections of a few times accordingly occur within the rise and recess regions. Another conceivable reason is as follows. That is, there are only a small number of boundaries between the rise regions and the recess regions, and dislocations are therefore bent insufficiently. Accordingly, threading dislocations are not reduced much, whereby the internal quantum efficiency is relatively low therein.

Warping of a wafer provided with the nitride semiconductor having the rise or recess regions shown in each of FIGS. 4A, 5A was smaller than that of a wafer provided with the nitride semiconductor having the rise or recess regions shown in each of FIGS. 2A, 2B, 3. It is considered that this is because the one provided with the rise or recess regions shown in each of FIGS. 4, 5 had a larger area at which the light transmitting substrate and the nitride semiconductor layer are in contact with each other, and stress is likely to be alleviated accordingly. As warping of wafers was smaller, yield was better upon grinding and polishing of the substrates as well as dividing of chips.

EXPERIMENTAL EXAMPLE 2

The following describes a method for forming a nitride semiconductor light emitting element in which an AlN buffer layer 16 was formed, as well as a result of measuring its output.

First, as with experimental example 1, the recess and rise regions each having the shape shown in FIG. 4A or FIG. 5A were formed on the surface of light transmitting substrate 1. As light transmitting substrate 1, a sapphire substrate was used. Light transmitting substrate 1 was placed on a heater provided within a chamber of a DC magnetron sputtering device, in which voltage is applied through the DC-continuous method.

Light transmitting substrate 1 was placed thereon so that the c-plane of light transmitting substrate 1 faced the surface of an Al target and the shortest distance between the center of the surface of the Al target and the c-plane of light transmitting substrate 1 was 50 mm. In this state, light transmitting substrate 1 was heated to 500° C. by the heater. Thereafter, only nitrogen gas was supplied to the inside of the chamber of the DC magnetron sputtering device at a flow rate of 20 sccm. The temperature of light transmitting substrate 1 was maintained at 500° C.

Then, a bias voltage of 3000 W was applied between light transmitting substrate 1 and the Al target through the DC-continuous method to generate nitrogen plasma. Pressure inside the chamber was maintained at 0.5 Pa, and nitrogen gas of 100 vol % was supplied to the inside of the chamber at a flow rate of 20 sccm. Through reactive sputtering employing the DC magnetron sputtering method, AlN buffer layer 16 constituted by an aggregate of AlN column crystals and having a thickness of 25 nm was provided on the c-plane of light transmitting substrate 1. AlN buffer layer 16 was formed at a rate of 0.04 nm/second on this occasion.

During both the nitriding of the c-plane of light transmitting substrate 1 and the formation of AlN buffer layer 16, a magnet in a cathode of the DC magnetron sputtering device was moved. Further, the formation of AlN buffer layer 16 continued only for a predetermined period of time in accordance with a previously measured film formation rate for AlN buffer layer 16. When AlN buffer layer 16 had a thickness of 25 nm, the generation of the nitrogen plasma was stopped to decrease the temperature of light transmitting substrate 1. The pressure in the chamber just before the sputtering was $1 \times 10^{-4}$ Pa or smaller.

Then, after forming AlN buffer layer 16, light transmitting substrate 1 was taken out of the chamber of the DC magnetron sputtering device and was placed in a vapor deposition reactor of an MOCVD device. If light transmitting substrate 1 having AlN buffer layer 16 formed thereon is heated by a heater of high-frequency induction heating type, it is placed on a susceptor made of graphite. On the other hand, if light transmitting substrate 1 having AlN buffer layer 16 formed thereon is heated by a heater of resistance heating type, it is placed on a tray made of quartz and positioned on a susceptor made of graphite.

With nitrogen gas and hydrogen gas being supplied as carrier gas while supplying ammonia gas to the inside of the vapor deposition reactor, the temperature of light transmitting substrate 1 was increased for approximately 15 minutes up to 1125° C. The pressure in the vapor deposition reactor was a normal pressure, a ratio of the flow rates of the hydrogen gas and the nitrogen gas each serving as carrier gas was set at 50/50.

After confirming that the temperature of light transmitting substrate 1 was stable at 1125° C., TMG (THROAT MIX GAS) gas started to be supplied to the inside of the vapor deposition reactor in order to form 5 µm thick non-doped GaN layer 2 on the surface of AlN buffer layer 16 through the MOCVD method. It should be noted that the TMG gas was supplied to the inside of the vapor deposition reactor so that a molar ratio of the group-V element to the group-III element (the number of moles of the group-V element/the number of moles of the group-III element) was 1500.

Then, with the temperature of light transmitting substrate 1 maintained at 1125° C., silane gas was supplied to the inside of the vapor deposition reactor to obtain a Si doping concentration of $1 \times 10^{19}/cm^3$, thereby forming Si-doped n type GaN layer 3 having a thickness of 3 µm, on the surface of non-doped GaN layer 2 through the MOCVD method.

The supply of the TMG gas and the hydrogen gas to the inside of the vapor deposition reactor was stopped, and thereafter the temperature of light transmitting substrate 1 was decreased to 870° C. Then, after confirming that a state inside the vapor deposition reactor became stable, TMG gas, TMI gas, and ammonia gas were supplied to the inside of the vapor deposition reactor as raw material gas. Further, silane gas was supplied to the inside of the vapor deposition reactor to obtain a Si doping concentration of $5 \times 10^{18}/cm^3$, thereby forming n type SL layer 4 constituted by Si-doped n type GaN and InGaN.

Next, the supply of the TMG gas, TME gas, and ammonia gas to the inside of the vapor deposition reactor was stopped, and then the temperature of light transmitting substrate 1 was decreased to 850° C. After confirming that the state inside the vapor deposition reactor became stable, TMG gas, TMI gas, and ammonia gas were supplied to the inside of the vapor deposition reactor as raw material gas. Further, silane gas was supplied to the inside of the vapor deposition reactor to obtain a Si doping concentration of $1 \times 10^{18}/cm^3$, thereby forming a Si-doped n type $In_{0.01}Ga_{0.99}N$ barrier layer having a thickness of 8 nm, on the surface of the n type GaN contact layer.

The supply of the silane gas was stopped, and thereafter TMG gas and TMI gas was supplied to form a well layer made of $In_{0.1}Ga_{0.9}N$ and having a thickness of 3 nm.

By repeating the procedure of forming the barrier layer and the well layer as described above, there was formed, on the surface of the n type $In_{0.01}Ga_{0.99}N$ barrier layer, light emitting layer 5 having an MQW constituted by a multiple quantum-well structure in which seven barrier layers each made of n type GaN and six well layers each made of $In_{0.1}Ga_{0.9}N$ are provided one by one alternately.

Then, the temperature of light transmitting substrate 1 was increased up to 1100° C., and the carrier gas was changed from the nitrogen gas to hydrogen gas. Then, TMG gas, TMA gas, and $CP_2Mg$ gas were supplied to the inside of the vapor deposition reactor for two minutes, and thereafter the supply of the TMG gas and the TMA gas was stopped. In this way, Mg-doped p type $Al_{0.2}Ga_{0.8}N$ layer 6 having a thickness of 20 nm was formed on the surface of light emitting layer 5, which serves as an MQW active layer.

While the temperature of light transmitting substrate 1 was maintained at 1100° C. and ammonia gas was supplied to the inside of the vapor deposition reactor, the supply of the TMA was stopped. Thereafter, amounts of supply of the TMG gas and the $CP_2Mg$ gas were changed to form, on the surface of p type $Al_{0.2}Ga_{0.8}N$ layer 6, Mg-doped p type GaN layer 7 having a thickness of 0.2 μm.

Immediately after the formation of p type GaN layer 7, supply of electric power to the heater was stopped and the carrier gas supplied to the inside of the vapor deposition reactor was changed from hydrogen gas to nitrogen gas. After confirming that the temperature of light transmitting substrate 1 reached or went below 300° C., light transmitting substrate 1 having the above-described layers formed thereon was taken out from the vapor deposition reactor. Steps thereafter are the same as those of experimental example 1 and therefore will not described repeatedly.

Figure 6:
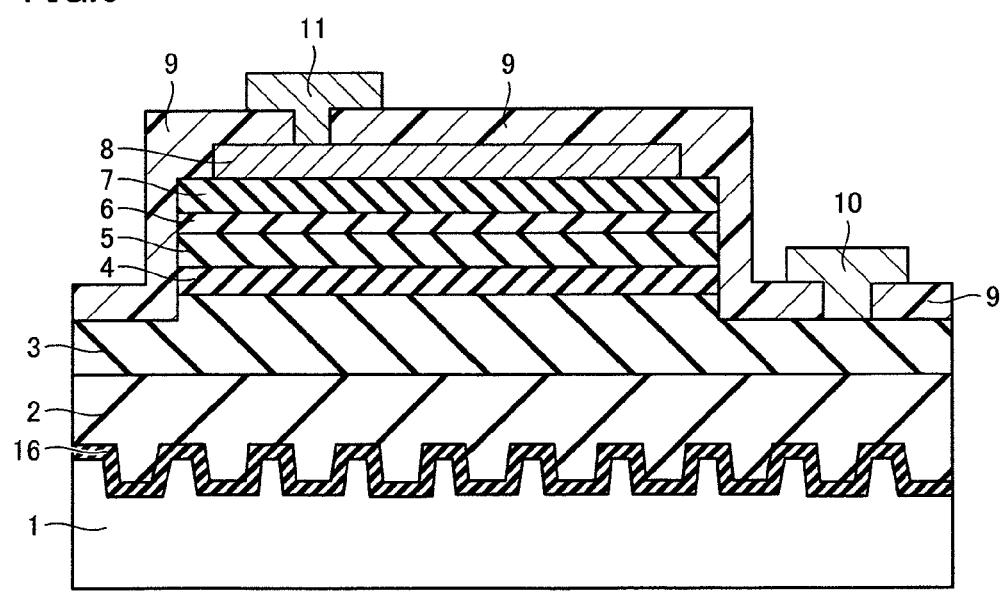
FIG. 6 is a cross sectional view showing a structure of a nitride semiconductor light emitting element manufactured in an experimental example 2.

FIG. 6 is a cross sectional view showing the structure of the nitride semiconductor light emitting element manufactured in experimental example 2. As shown in FIG. 6, AlN buffer layer 16 was formed on the upper surface of light transmitting substrate 1. AlN buffer layer 16 was formed on at least the upper surfaces of the rise regions and the bottom surfaces of the recess regions in the upper surface of light transmitting substrate 1.

On the upper surface of p type GaN layer 7, current diffusing layer 8 having a thickness of approximately 200 nm was formed. Current diffusing layer 8 was formed of ITO. Insulative protecting film 9 was formed to cover the upper surfaces of current diffusing layer 8 and n type GaN layer 3, with portions thereof left uncovered. Insulative protecting film 9 had a thickness of approximately 200 nm and was formed of $SiO_2$.

On the upper surface of current diffusing layer 8 at the portion not covered with insulative protecting film 9, p type pad electrode 11 was formed. On the upper surface of n type GaN layer 3 at the portion not covered with insulative protecting film 9, n type pad electrode 10 was formed. Each of n type pad electrode 10 and p type pad electrode 11 was formed by layering Ti with a thickness of approximately 20 nm, Mo with a thickness of approximately 30 nm, and Au with a thickness of approximately 500 nm.

The characteristic of the manufactured nitride semiconductor light emitting element in a bare chip state was 33 mW at 20 mA and driving voltage was 3.0 V. Further, the half-width of an X-ray rocking curve at the (004) plane was 30 arcsec, which was significantly improved from 400 arcsec of the one manufactured using a conventional technique. Thus, it was found that high quality crystals were obtained.

The use of the recess and rise regions and the AlN buffer layer of the present invention provides narrowed half-width in the X-ray rocking curve and therefore provides high quality crystals in which voids are not formed and threading dislocation density is low, thereby achieving improved light output of the light emitting element and reduced operation voltage.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor light emitting element in which a nitride semiconductor layer including at least a light emitting layer is formed on a light transmitting substrate,
    said light transmitting substrate having an upper surface on which a plurality of recess regions and rise regions are formed, wherein:
    one of each of said recess regions and each of said rise regions is formed by a polygon having at least one apex having an interior angle of 180° or greater when viewed in a planar view, and
    the other of each of said recess regions and each of said rise regions is formed not to be connected to one another in a straight line in all directions when viewed in a planar view.

2. The nitride semiconductor light emitting element according to claim 1, wherein:
    said polygon has a plurality of projecting portions projecting radially with spaces between adjacent projecting portions of said polygon, and
    in each of said spaces at said polygon, a projecting portion of an adjacent polygon is disposed.

3. The nitride semiconductor light emitting element according to claim 1, wherein sides constituting said polygon include a side parallel to a crystal plane in said nitride semiconductor layer.

4. The nitride semiconductor light emitting element according to claim 1, wherein said polygon is constituted by sides in <11-20> directions of crystal axes in said nitride semiconductor layer.

5. The nitride semiconductor light emitting element according to claim 1, wherein each of said recess regions and said rise regions, has a width of 20 μm or smaller.

6. The nitride semiconductor light emitting element according to claim 1,
    wherein each of said rise regions/each of said recess regions has a height/depth of 40 nm or greater.

7. The nitride semiconductor light emitting element according to claim 1,
    wherein each of said recess regions and said rise regions has a tapered side surface.

8. The nitride semiconductor light emitting element according to claim 1, wherein the other of each of said recess regions and each of said rise regions is formed to be connected to one another in a continuous manner when viewed in a planar view.

9. The nitride semiconductor light emitting element according to claim 1, wherein said one of each of said recess regions and each of said rise regions is formed in a discontinuous manner when viewed in a planar view.

10. The nitride semiconductor light emitting element according to claim 1, wherein said light transmitting substrate has a refractive index smaller than that of said nitride semiconductor layer.

11. The nitride semiconductor light emitting element according to claim 1, wherein said light transmitting substrate has a higher transmittance for emitted light than that of said nitride semiconductor layer.

12. The nitride semiconductor light emitting element according to claim 1, wherein said nitride semiconductor layer includes an n type nitride semiconductor layer, said light emitting layer, and a p type nitride semiconductor layer.

13. The nitride semiconductor light emitting element according to claim 12, wherein said p type nitride semiconductor layer has a surface on which a current diffusing layer is formed.

14. The nitride semiconductor light emitting element according to claim 13, wherein said current diffusing layer includes a transparent conductive film.

15. The nitride semiconductor light emitting element according to claim 13, wherein one of said p type nitride semiconductor layer and said current diffusing layer has a surface on which a reflecting layer for reflecting emitted light is formed.

16. The nitride semiconductor light emitting element according to claim 1, wherein an AlN buffer layer is formed on the upper surface of said light transmitting substrate.

* * * * *